United States Patent [19]
Bastian et al.

[11] Patent Number: 5,874,162
[45] Date of Patent: Feb. 23, 1999

[54] WEIGHTED SINTERING PROCESS AND CONFORMABLE LOAD TILE

[75] Inventors: Kurt E. Bastian, Poughkeepsie; James J. Burte, Middlehope, both of N.Y.; Michael A. Cohn, Ramsey, N.J.; Christopher N. Collins, Poughkeepsie, N.Y.; Joseph P. DeGeorge, Wappingers Falls, N.Y.; Italo A. DiNunzio, Yonkers, N.Y.; Robert C. Greenlese, LaGrangeville, N.Y.; Alan Piciacchio, Fishkill, N.Y.; Teresa L Pinto, Newburgh, N.Y.; Robert J. Sullivan, Pleasant Valley, N.Y.; Ryan W. Wuthrich, Fishikill, N.Y.

[73] Assignee: International Business Machines Corporation, Armonk, N.Y.

[21] Appl. No.: 729,083
[22] Filed: Oct. 10, 1996
[51] Int. Cl.$^6$ .................................................. B32B 3/00
[52] U.S. Cl. .................... 428/210; 428/688; 428/689; 428/702
[58] Field of Search .................................. 428/210, 640, 428/688, 689, 702, 901

[56] References Cited

U.S. PATENT DOCUMENTS

| | | |
|---|---|---|
| 3,879,509 | 4/1975 | Elderbaum . |
| 4,259,061 | 3/1981 | Dubetsky . |
| 4,340,436 | 7/1982 | Dubetsky et al. . |
| 4,684,339 | 8/1987 | Bezama et al. . |
| 5,085,720 | 2/1992 | Mikeska et al. . |
| 5,102,720 | 4/1992 | Raj . |
| 5,130,067 | 7/1992 | Flaitz et al. . |
| 5,277,723 | 1/1994 | Kodama et al. . |
| 5,316,989 | 5/1994 | James . |
| 5,474,741 | 12/1995 | Mikeska et al. . |

FOREIGN PATENT DOCUMENTS 03-356884  12/1991  Japan .

OTHER PUBLICATIONS

IBM Technical Disclosure Bulletin, vol. 14 No. 10, Mar. 1972, L.F. Muenkel, "Porous Platens for Multilayer Ceramics Lamination".

IBM Technical Dislosure Bulletin, vol. 23 No. 5, Oct. 1980, J.M. Brownlow, et al, "Method for Reduction of Shrinkage Distortion in Ceramic Substrates".

*Primary Examiner*—Elizabeth Evans
*Attorney, Agent, or Firm*—Whitham, Curtis & Whitham; Steven J. Soucar, Esq.

[57] ABSTRACT

Camber of ceramic substrates is prevented by placing a conformable load tile over substrates during sintering. The conformable load tile has an initial curvature that facilitates escape of substrate binder gases during a burn out cycle. Subsequently, the conformable load tile conforms to the substrates under the higher heat of sintering temperature to maintain flatness of the substrates. To prevent sticking of the conformable load tile to the substrates, the conformable load tile is provided with a nonstick surface.

11 Claims, 4 Drawing Sheets

WEIGHTED SINTERING PROCESS AND CONFORMABLE LOAD TILE

BACKGROUND OF THE INVENTION

1. Field of the Invention

The present invention generally relates to computer chip substrate manufacture and, more particularly, to reducing the need for ceramic substrates to be reworked after sintering.

2. Background Description

Some ceramic substrates have camber (a degree of nonflatness) that is greater than allowed after sintering. These substrates must be put in a "rework" operation called flattening. In this operation, a mass or load is placed on an alumina interposer, and the load and alumina interposer is placed on the substrates. This assembly of load, alumina interposer and substrates is subsequently "re-fired" at a temperature lower than the sintering temperature.

The flattening operation alleviates the camber problem, but traditionally introduces problems such as adhesion of nonelectrically conducting material onto electrically conducting features of the substrate, in addition to adding cost to the product due to the additional flattening process.

In the past, loads have been used during sintering to keep substrates flat, but with certain substrate materials, such as those containing glass, other problems are generated, such as substrates adhering to the loads. An interface material has been used to separate the load and the substrate, but to make electrical contact, the interface layer must be removed, usually by lapping. Sticking of the load to substrates is also influenced by the amount of load applied to the substrates. To keep a tile flat during the high temperatures usually requires a greater thickness, thereby increasing the minimum mass of the tile and increasing the likelihood of the tiles sticking to a substrate containing glass.

Another problem is that a rigid load will not maintain its flatness over time and will require rework or replacement. Once deformed, it will not make intimate contact with the substrate and not apply the load correctly. Furthermore, a flat, rigid load does not allow for gas flow at lower temperatures which assists binder burnout.

Referring now to the drawings, the problems which have been described are illustrated in FIGS. 1, 2 and 3. In FIG. 1, the sintering process is represented by arrow 11. No load is used to inhibit camber. At first the substrates 12 are flat. As the cycle proceeds, the high heat of sintering makes the substrates curve; i.e., to take a camber. The substrates remain curved when the cycle finishes.

The positive aspect of this free sintering method is that binder burn out is uninhibited. Uninhibited binder burn out ensures that no carbon will be trapped in the substrate after sintering. Carbon burn off occurs early in the sintering cycle. At very high temperatures, carbon will become trapped on the substrate surface, so it is important that carbon burn off occurs before sintering begins.

FIG. 2 shows cross sections of two substrates 22 when they are sintered with a rigid load 23. Again, the cycle is represented by an arrow 21. To begin, the substrates 22 are covered with the load 23. During the high heat portion of the cycle, the load and the substrates remain flat. At the end of the cycle, the load is removed and the flat substrates remain.

While a flat substrate is produced at the end of the cycle illustrated in FIG. 2, the rigid load inhibits binder burn out. If carbon is trapped in the substrate, the substrate will have more porosity and electrical properties will be degraded. In addition, over time this rigid load will become distorted in shape as a result of heating during sintering cycles, requiring reworking or replacing of the load.

A distorted rigid load is shown in FIG. 3. At the beginning of the cycle 31, the distorted load 33 is set on the substrates 32, but does not make intimate contact with the substrates 32. The distortion in this load increases binder burnout because of the lack of intimate contact made by the load. When the high heat sintering begins, the substrates 32 curve (i.e., take a camber) in the heat because the load 33 is not applying pressure evenly to the substrates 32. When the cycle is finished, the load is removed and the substrates 32 retain a camber.

The problem this invention solves is to reduce and/or eliminate the number of times a substrate is required to go through the flattening operation and also to reduce the amount of nonelectrically conducting material adhering as a contaminant to an electrically conducting feature on the substrate.

SUMMARY OF THE INVENTION

It is therefore an object of the present invention to provide a load which does not stick to substrates during a flattening process, reduces camber in the substrates, and yet allows gas flow at low temperatures (binder burnout).

According to the convention, the solution provided is to place a load in the form of a conformable tile on substrates in the sintering operation to reduce the substrate camber. The tile is made of alumina, which is a refractory material capable of withstanding high sintering temperatures. The tile is thin enough to creep during sintering, ensuring intimate contact loading with the substrate(s).

Another property of the refractory material used for the tile according to the invention is the uniformity of the grain size, which enhances creep. At high temperature, grains can slide relative to one another along grain boundaries. The additional feature of creep of the tile material allows the tile to be used when it is not flat, because the tile material will creep to a new position to conform with the substrate(s).

The refractory material load tile according to this invention conforms to the substrate(s). This applies the correct pressure required to produce a flat substrate after the sintering process.

The load tile according the invention may be used more than once without reworking, or flattening, in between uses. A load tile which has conformed to a substrate or substrates during heating is simply lifted off the substrate or substrates and can be placed on a new substrate or substrates. The load tile will then conform to the new substrate or substrates during heating.

The aspect of maintaining flatness in the substrate is important during the high temperature part of the process because camber usually begins at the high temperature region of the process. However, an initially nonflat load allows gas flow at low temperatures (the temperatures at which binder burnout occurs) that is hindered by a flat load. Thus, according to one aspect of the invention, the load tile is initially nonflat and creeps into position at high temperatures to apply a uniform load on the substrate(s) to prevent camber.

According to another aspect of the invention, the surface of the refractory material which comprises the load tile is coated with flame sprayed alumina to prevent the substrate (s) from sticking to the refractory material tile.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
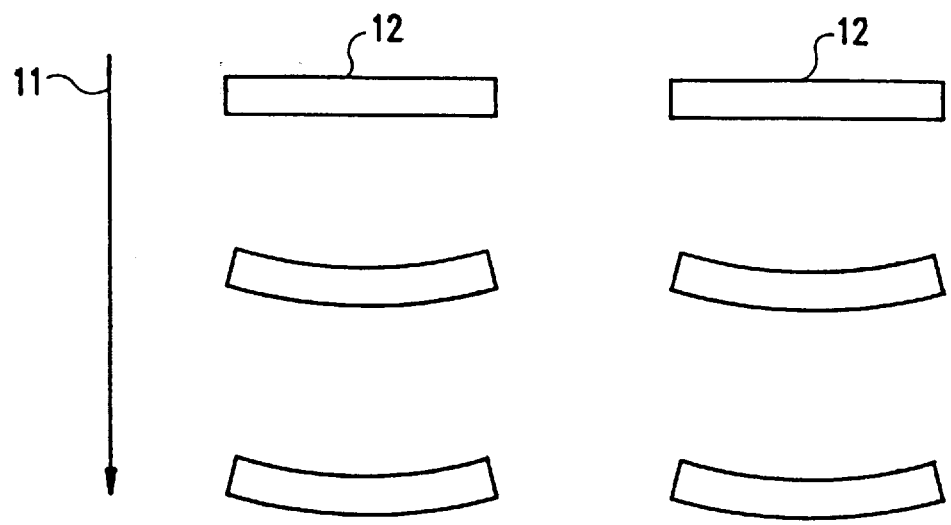
FIG. 1 shows cross sections of two ceramic substrates during sintering without a load.
Figure 2:
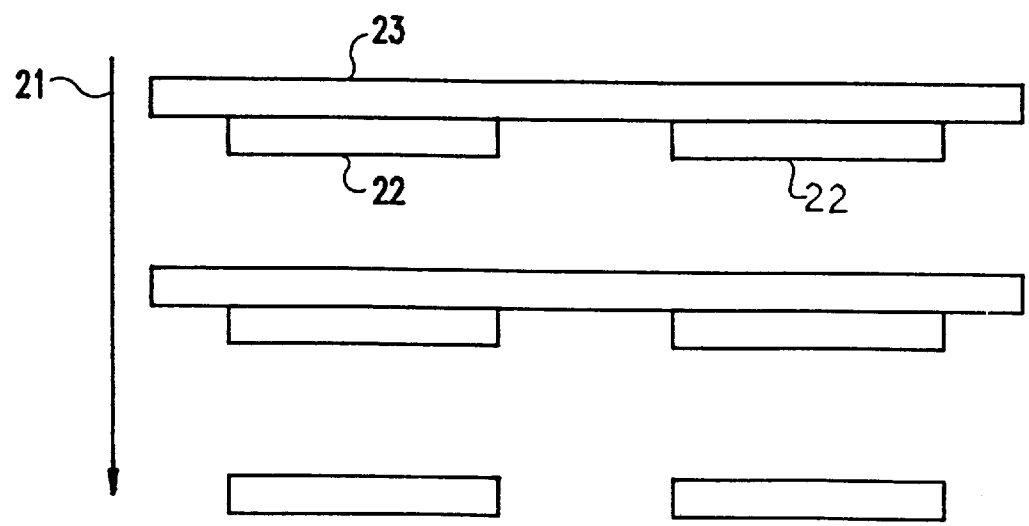
FIG. 2 shows cross sections of two ceramic substrates during sintering with a conventional load.
Figure 3:
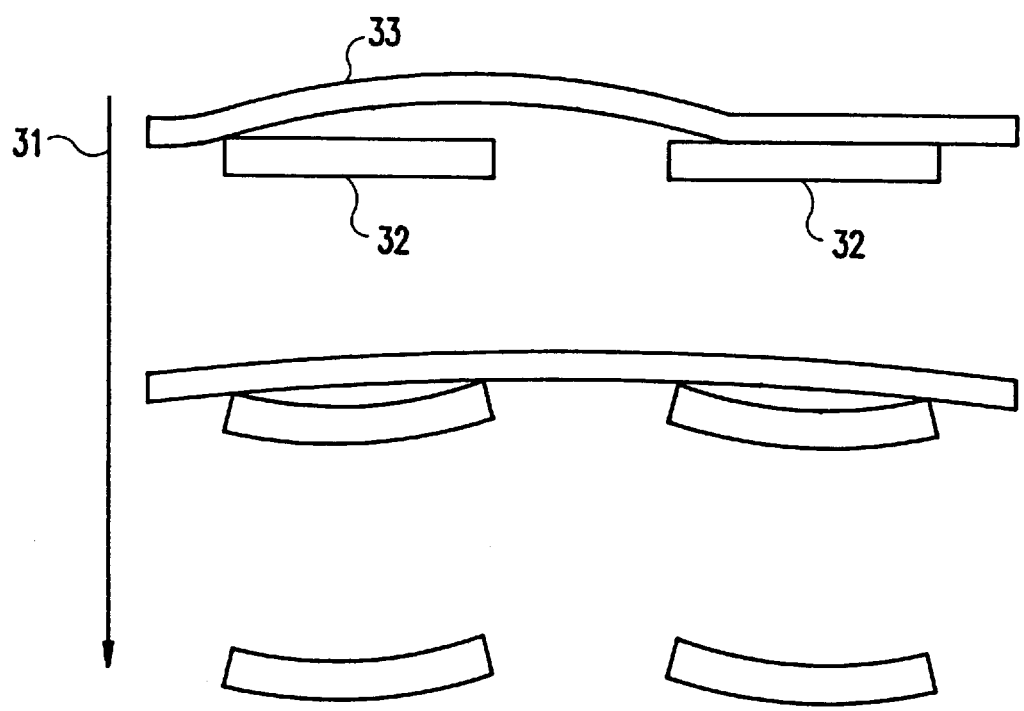
FIG. 3 shows cross sections of two ceramic substrates during sintering with a conventional load which has been through the sintering process more than once.
Figure 4:
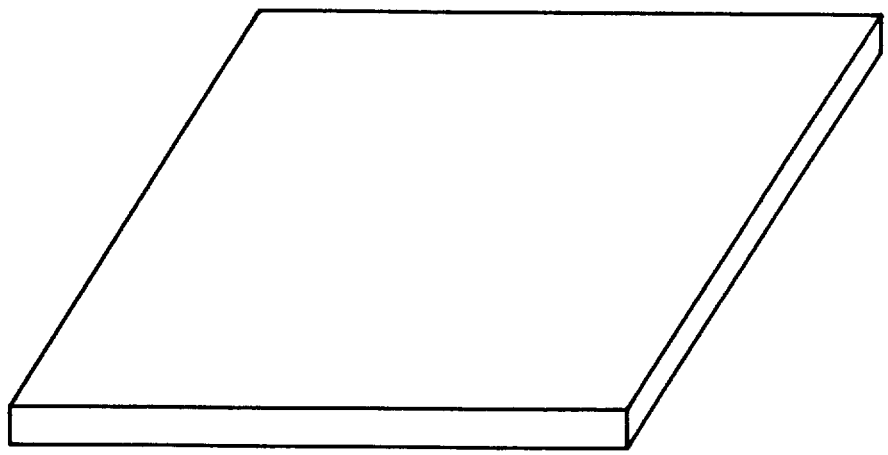
FIG. 4 is an isometric projection and FIG. 4A is a cross-sectional view showing the tile of the present invention.
Figure 4A:
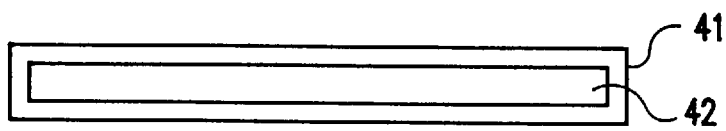

The solution to the above-described problems is the conformable tile of present invention shown in FIG. 4 in the form of a square card. As best seen in FIG. 4A, a nonstick coating 41 preferably covers the conformable tile 42.

The conformable tile is preferably alumina based, having a preferred uniform grain size of between 1 and 10 microns. The tile may be composed of about 99% or greater by weight of alumina ($Al_2O_3$) and about 1% or less by weight of silicon dioxide ($SiO_2$) and being approximately 0.025 inches thick and an initial surface flatness of 200 to 300 micro inches RMS (root mean, squared). In a preferred embodiment, the tile is composed of $Al_2O_3$ with up to 0.5% by weight of $SiO_2$ and up to 0.1% by weight of magnesium oxide (MgO).

The nonstick coating 41 should be a material which is nonreactive to the substrate material. It can be chemically similar to the substrate, but that is not necessary. In a preferred embodiment, the composition of the coating 41 is about 99% or greater by weight $Al_2O_3$ and about 1% or less by weight $SiO_2$ applied to a thickness of 0.003 to 0.005 inches. In preparing the coating, it has been found that a coating having a grain size of between 1 to 3 microns and a surface roughness between 4 to 7 microns provides the best nonstick finish. These grain structures are achieved by plasma application of the coating.

The conformable tile is meant to be used during the step of sintering in preparing substrates. Before first use in a furnace, the tile is flat, but after first use in a furnace, the tile may typically have a central depression with its edges turned down. The tile is placed over substrates to be fired with its edges pointing down. The edges are in contact with the edges of the substrates and the center of the tile is spaced from the substrates. The spacing permits gas generated during burning off of the binder to escape and not be trapped next to the substrate as would occur if the tile were initially flat. As the temperature approaches the sintering temperature, the tile flattens to contact the tops of the substrates to provide a load that inhibits the substrates from having a camber. During the cool down, the tile resumes the shape wherein it has a central depression.

Briefly summarizing, the tile of the present invention may be used over several substrates at the same time and may be used again and again without reforming. The tile does not begin to conform to the shape of the substrates until after burn off of gases, but before substrates begin to take a camber.

Figure 5:
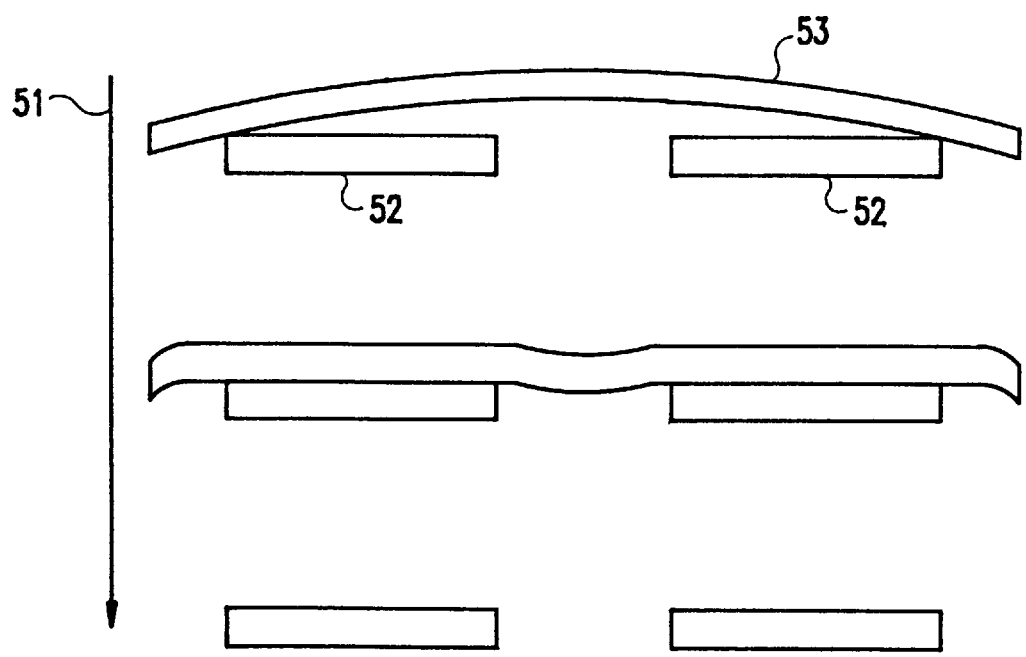
FIG. 5 shows cross sections of two ceramic substrates during sintering with the load of the present invention.

The invention can be further understood by referring to FIG. 5. The load tile of the present invention is shown in FIG. 5. At the beginning of the cycle 51, the load 53 is set on the substrates 42. The load after first use in a furnace is curved as shown in FIG. 5. The curvature of this load tile 43 increases binder burnout. During the high heat portion of the cycle, the load 53 conforms to the substrates 52, thus making intimate contact with the substrates 52. As shown in FIG. 5, the conformable load tile of this invention typically forms a central depression 54 with its edges turned down during the sintering process. At the end of the cycle, the load 53 is removed, and the substrates 52 are flat.

With the conformable load tile according to the invention, binder burn out can be increased at the beginning of the sintering cycle while ensuring that the tile will creep and make intimate contact with the substrates during the high heat portion of the sintering process, before the ceramic substrates have a chance to curve and take a camber in the heat.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A conformable load for use in preventing camber when sintering substrates comprising:

an alumina ($Al_2O_3$) based tile, said alumina based tile having between 0 and 1% by weight of silicon dioxide ($SiO_2$) and a uniform grain size to enhance creep of the tile during sintering; and a plasma coating on said alumina based tile forming a nonstick surface.

2. The conformable load for use in preventing camber when sintering substrates as recited in claim 1 wherein said $Al_2O_3$ based tile has between 0 and 0.5% by weight of $SiO_2$ and 0 and 0.1% by weight of magnesium oxide (MgO).

3. The conformable load for use in preventing camber when sintering substrates as recited in claim 1 wherein said plasma coating is about 99% or greater $Al_2O_3$ and 1% or greater $SiO_2$ by weight.

4. A conformable load for use in preventing camber when sintering substrates comprising:

an alumina ($Al_2O_3$) based tile, said alumina based tile having between 0 and 1% by weight of silicon dioxide ($SiO_2$) and a uniform grain size between 1 and 10 microns to enhance creep of the tile during sintering; and a plasma coating on said alumina based tile forming a nonstick surface.

5. A conformable load for use in preventing camber when sintering substrates comprising:

an alumina ($Al_2O_3$) based tile, said alumina based tile having between 0 and 0.5% by weight of silicon dioxide ($SiO_2$) and 0 and 0.1% by weight magnesium oxide (MgO) and a uniform grain size to enhance creep of the tile during sintering; and a plasma coating having a surface roughness between 4 and 7 microns on said alumina based tile forming a nonstick surface.

6. A conformable load for use in preventing camber when sintering substrates comprising:

an alumina ($Al_2O_3$) based tile, said alumina based tile having between 0 and 0.5% by weight of silicon dioxide ($SiO_2$) and 0 and 0.1% by weight magnesium oxide (MgO) and a uniform grain size to enhance creep of the tile during sintering; and a plasma coating having a grain size between 1 and 3 microns on said alumina based tile forming a nonstick surface.

7. A conformable load for use in preventing camber when sintering substrates comprising:

an alumina ($Al_2O_3$) based tile approximately 0.025 inches thick, said alumina based tile having between 0 and 1% by weight of silicon dioxide ($SiO_2$) and a uniform grain size to enhance creep of the tile during sintering; and a plasma coating between 0.003 and 0.005 inches thick on said alumina based tile forming a nonstick surface.

8. A conformable load for use in preventing camber in substrates when sintering substrates, said load being made of a material which creeps during sintering to conform to a shape of said substrates.

9. The conformable load for use in preventing camber as in claim 8 wherein said load has a nonstick surface treatment making the load easily removable from said substrates after sintering.

10. The conformable load as recited in claim 8 wherein said material is principally alumina ($Al_2O_3$) with a uniform grain size.

11. The conformable load as recited in claim 8 wherein said nonstick surface treatment is a plasma coating of alumina.

* * * * *

UNITED STATES PATENT AND TRADEMARK OFFICE
CERTIFICATE OF CORRECTION

PATENT NO. : 5,874,162
DATED : February 23, 1999
INVENTOR(S) : Kurt E. Bastian et al.

It is certified that error appears in the above-identified patent and that said Letters Patent is hereby corrected as shown below:

column 2, line 25, delete "convention" and replace with --invention--.

Signed and Sealed this

Eleventh Day of January, 2000

Attest:

Q. TODD DICKINSON

*Attesting Officer*   *Acting Commissioner of Patents and Trademarks*